(12) United States Patent
Piccardi

(10) Patent No.: US 10,673,398 B2
(45) Date of Patent: Jun. 2, 2020

(54) AUTO-ZERO TECHNIQUE FOR OPAMPS WITH A SOURCE-FOLLOWER OUTPUT STAGE BASED ON REPLICA REFERENCING

(71) Applicant: Micron Technology, Inc., Boise, ID (US)

(72) Inventor: Michele Piccardi, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/162,975

(22) Filed: Oct. 17, 2018

(65) Prior Publication Data

US 2020/0127623 A1   Apr. 23, 2020

(51) Int. Cl.
| | |
|---|---|
| *H03F 1/02* | (2006.01) |
| *H03F 3/45* | (2006.01) |
| *H03F 1/08* | (2006.01) |
| *H03G 3/30* | (2006.01) |

(52) U.S. Cl.
CPC ......... *H03F 3/45183* (2013.01); *H03F 1/086* (2013.01); *H03G 3/30* (2013.01); *H03F 2200/129* (2013.01); *H03F 2200/159* (2013.01); *H03F 2200/267* (2013.01); *H03F 2200/318* (2013.01); *H03F 2200/375* (2013.01); *H03F 2200/396* (2013.01); *H03F 2200/69* (2013.01); *H03F 2203/45116* (2013.01); *H03F 2203/45212* (2013.01); *H03F 2203/45354* (2013.01); *H03F 2203/45356* (2013.01); *H03F 2203/45444* (2013.01)

(58) Field of Classification Search
CPC .................................. H03F 1/02; H03F 3/005
USPC ............................................. 330/9; 327/124
See application file for complete search history.

(56) References Cited

U.S. PATENT DOCUMENTS 8,344,797 B2 *   1/2013   Crespi ..................... H03F 1/301
                                                              330/9

* cited by examiner

*Primary Examiner* — Steven J Mottola
(74) *Attorney, Agent, or Firm* — Schwegman Lundberg & Woessner, P.A.

(57) ABSTRACT

An electronic circuit comprises an input stage, a gain stage operatively coupled to the input stage, a primary output stage operatively coupled to the gain stage, a replica output stage operatively coupled to the gain stage in parallel to the primary output stage, and a clock circuit. The clock circuit operates the electronic circuit in multiple phases including a sampling phase to disconnect the primary output stage and the replica output stage from the gain stage to obtain an offset voltage, an active phase to reconnect the primary output stage to apply the offset voltage to reduce an offset at the primary output stage, and an intermediate phase to first reconnect the replica output stage to the gain stage prior to the active phase.

19 Claims, 8 Drawing Sheets

800

805 — DISCONNECTING A SOURCE-FOLLOWER OUTPUT STAGE OF THE OPAMP CIRCUIT AND A REPLICA SOURCE-FOLLOWER STAGE OF THE OPAMP CIRCUIT FROM A GAIN STAGE OF THE OPAMP CIRCUIT

810 — APPLYING VOLTAGE OF A FIRST SAMPLE-AND-HOLD CAPACITOR TO THE SOURCE-FOLLOWER OUTPUT STAGE, AND SAMPLING AN OFFSET VOLTAGE OF THE GAIN STAGE OF THE OPAMP CIRCUIT ONTO A SECOND SAMPLE-AND-HOLD CAPACITOR

815 — CONNECTING A SOURCE OR DRAIN OF AN OUTPUT TRANSISTOR OF THE REPLICA OUTPUT STAGE TO THE GAIN STAGE

820 — DISCONNECTING THE SOURCE OR DRAIN OF THE OUTPUT TRANSISTOR OF THE REPLICA OUTPUT STAGE FROM THE GAIN STAGE

825 — RECONNECTING A GATE OF AN OUTPUT TRANSISTOR OF THE SOURCE-FOLLOWER OUTPUT STAGE AND APPLYING THE OFFSET VOLTAGE TO THE GATE OF THE OUTPUT TRANSISTOR OF THE SOURCE-FOLLOWER OUTPUT STAGE

AUTO-ZERO TECHNIQUE FOR OPAMPS WITH A SOURCE-FOLLOWER OUTPUT STAGE BASED ON REPLICA REFERENCING

BACKGROUND

Electronic circuits and systems often include one or more operational amplifiers (opamps). Opamps are included in many different types of electronic circuits including circuits that amplify a signal. Ideally an opamp has zero offset voltage. An offset voltage is typically an unwanted voltage added to signals processed by an electronic circuit. In real (non-ideal) opamps, a non-zero offset voltage results from variations (e.g., variations in process, geometry, temperature, etc.) in the circuits that make up the opamp circuit. It is desirable to reduce the offset of opamps to improve performance of electronic circuits.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 8 is a flow diagram of a method of operating an opamp circuit.

DETAILED DESCRIPTION

Figure 1:
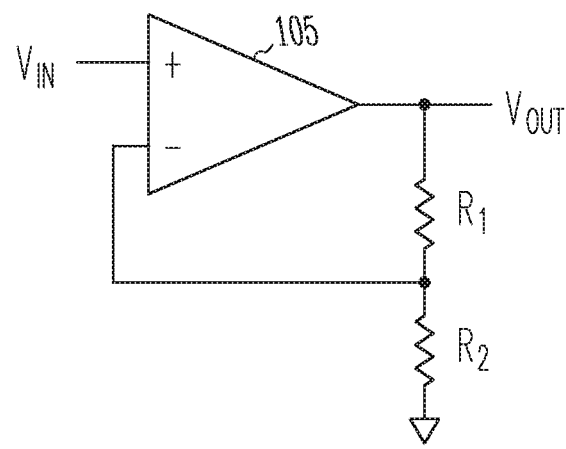
FIG. 1 is an example of a signal amplifying circuit that includes an opamp circuit.

FIG. 1 is an example of a signal amplifying circuit that includes an opamp. The circuit has a closed loop gain of $(1+R_2/R_1)$. The input-referred offset of the opamp ($\sigma_{IN}$) is magnified by the closed loop gain of the circuit, or $$\sigma_{OUT}=\sigma_{IN}(1+R_2/R_1),$$

where $\sigma_{OUT}$ is the output-referred offset of the overall circuit. In general, for any circuit that amplifies an input signal by a gain factor, the output-referred offset will be equal to the input-referred offset multiplied by the gain factor.

Figure 2:
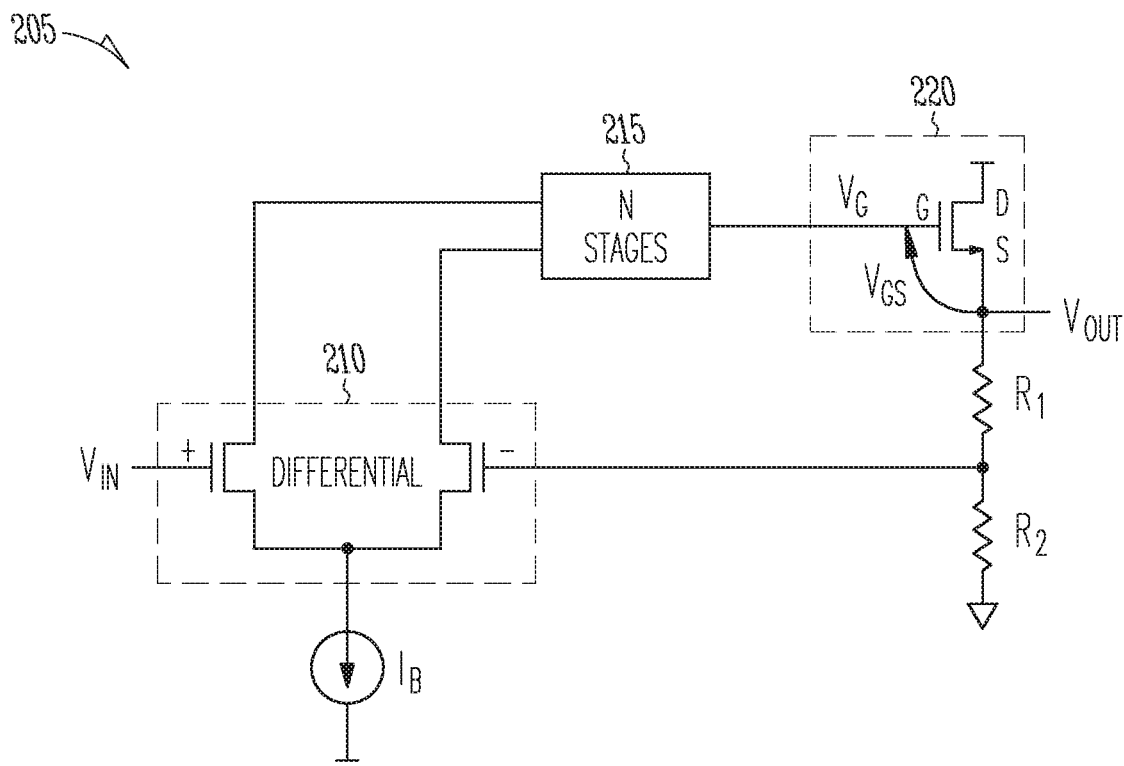
FIG. 2 is a circuit diagram of the signal amplifying circuit of FIG. 1 showing more detail of the opamp circuit.

FIG. 2 is a circuit diagram of the example the signal amplifying circuit of FIG. 1 showing more detail of the opamp circuit. The opamp 205 includes an input stage 210, a gain stage 215, and an output stage 220. The input stage 210 includes a differential transistor pair and a bias current $I_B$. Each circuit element of an opamp contributes to the offset voltage $\sigma_{IN}$ of the opamp, but the differential pair of the input stage is typically the biggest contributor to the offset. The gain stage 215 may comprise a number N of intermediate gain stages, where N is an integer of one or greater. More intermediate gain stages provide more open loop gain to the opamp.

The output stage 220 includes an output transistor connected as a source-follower. The transistor is an n-type field effect transistor (NFET), and a signal from the gain stage 215 input to the output stage 220 is applied to the gate terminal (G) of the transistor. The output signal is taken from the source terminal (S). The output stage 220 has a high current driving capability because the output impedance of the output stage is low and is approximately equal to the inverse of the transconductance (gm), or 1/gm, of the output transistor. Assuming the output transistor of the output stage 220 works in the saturation region, the gate voltage ($V_G$) of the gate terminal of the output transistor is related to the output voltage ($V_{OUT}$) in terms of direct current (DC) biasing and transient biasing, as shown in the equations below.

$$V_G=V_{OUT}+V_{GS},$$

$$Ids=(\tfrac{1}{2})(\mu n \cdot C_{OX})(W/L)(V_{GS}-Vth)^2, \text{ and}$$

$$V_{GS}=\{2 \cdot Ids/[(\mu n \cdot C_{OX})(W/L)]\}^{1/2}+Vth,$$

where $V_{GS}$ is the voltage between the gate terminal and the source terminal of the transistor, Ids is the current from the drain terminal to the source terminal, $\mu n$ is the mobility of the carriers (electrons) in the NFET, $C_{OX}$ is the capacitance of the gate oxide of the transistor, W and L are width and length of the channel of the transistor, and Vth is the threshold voltage of the transistor.

Figure 3:
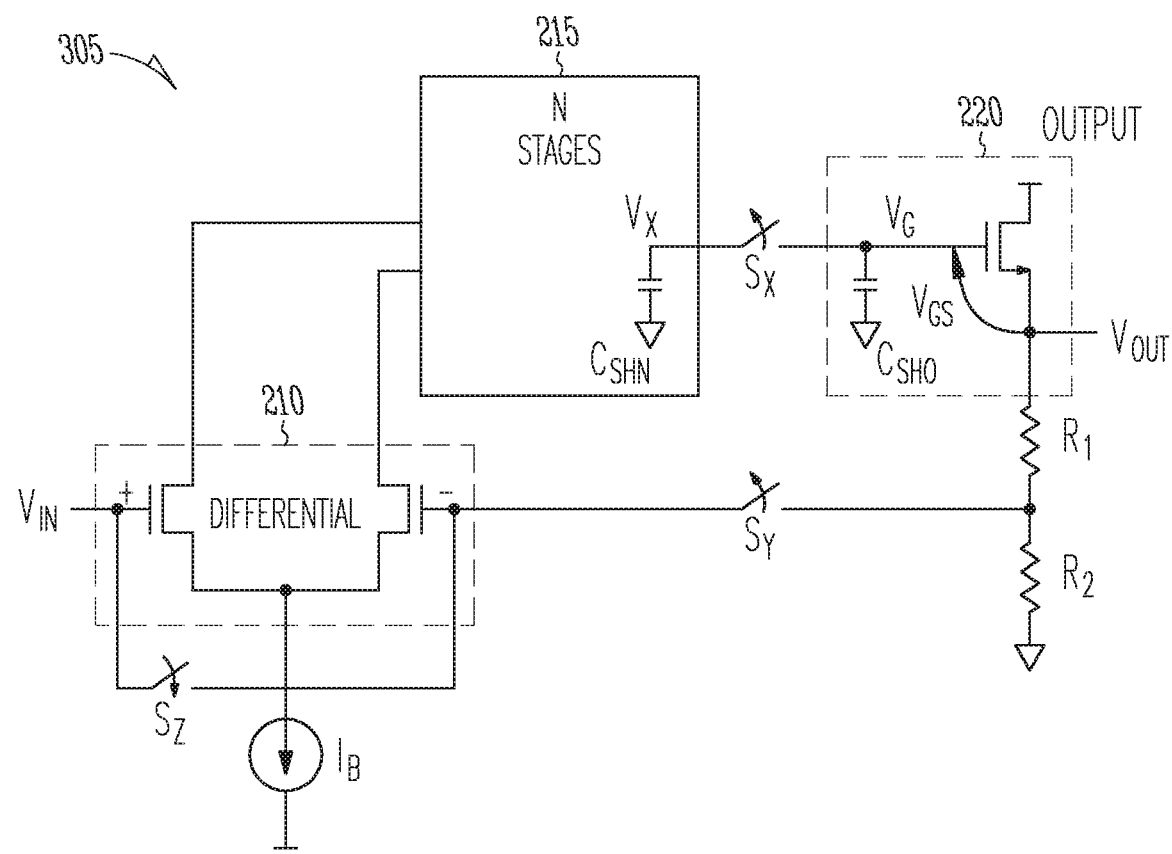
FIG. 3 is a circuit diagram of an opamp circuit and an auto-zeroing circuit.
Figure 4A:
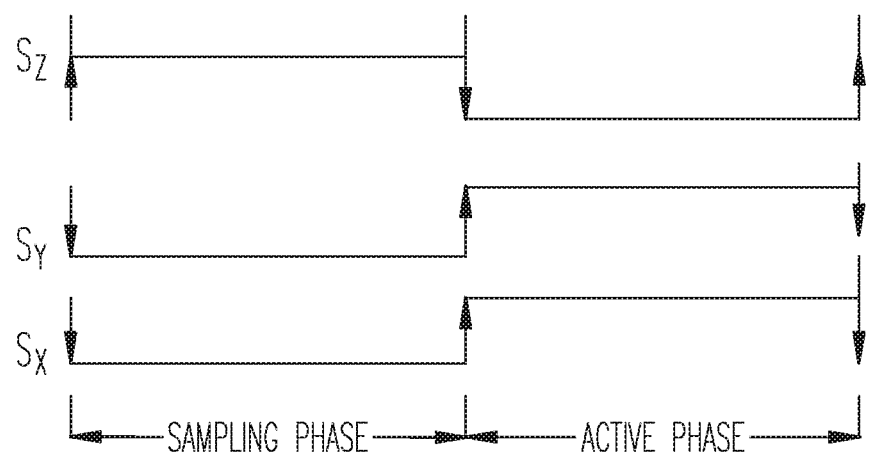
FIGS. 4A and 4B are illustrations of clock signal waveforms used to operate the switches of the circuits described herein.

FIG. 3 is a circuit diagram of an approach to reducing the offset (auto-zeroing) of the opamp of FIG. 2. The opamp 305 includes an auto-zeroing circuit that includes a number of switches $S_X$, $S_Y$, and $S_Z$, and two sample-and-hold capacitors $C_{SHN}$ and $C_{SHO}$. The auto-zeroing technique includes a sampling phase and an active phase. FIG. 4A is an illustration of clock signal waveforms used to operate the switches of the circuit of FIG. 3 in the sampling phase and the active phase. It is assumed that a "high" level on a waveform activates (closes) the switch, and a "low" level on the waveform deactivates (opens) the switch. The horizontal axis is time. During the sampling phase, switches $S_X$ and $S_Y$ are open (or deactivated) and the offset from the gain stage is sampled onto capacitor $C_{SHN}$. The gate of the output transistor of the output stage 220 is held to a voltage of about $V_G$ by sample-and-hold capacitor $C_{SHO}$ during the sampling phase to keep the output stable. Also during the sampling phase, switch $S_Z$ is closed (or activated) so that the gates of the differential pair of the input stage are both connected to $V_{IN}$. The voltage on capacitor $C_{SHN}$ is used to reduce the offset of the output of the opamp during the active phase.

In the active phase, switch $S_Z$ is open and $S_Y$ is closed to restore the normal connections to the differential pair of the input stage 210. Switch $S_X$ is closed to connect the gain stage 215 to the output stage 220. The voltage sampled onto capacitor $C_{SHN}$ can be used as a current source or a voltage source to reduce the offset of the opamp. When switch $S_X$ is closed, there is a transient charge sharing between capacitors $C_{SHN}$ and $C_{SHO}$ due to a mismatch in DC voltage value between the output voltage of the last stage of the gain stage during the sampling phase and the gate of the output transistor in the active phase.

Figure 5:
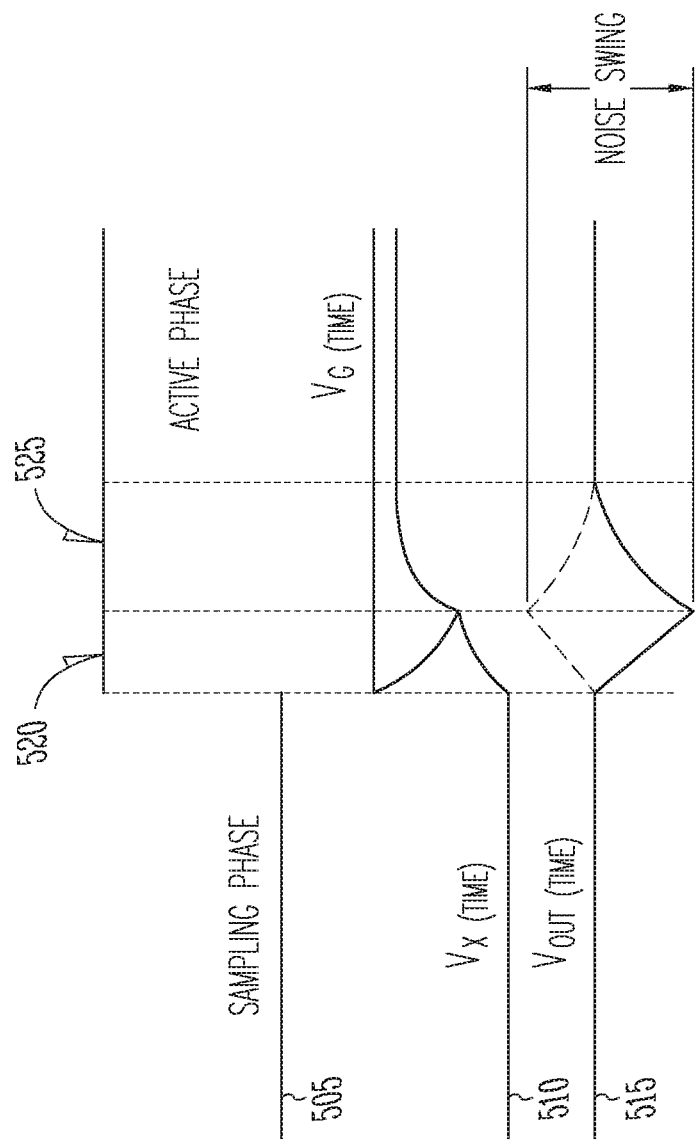
FIG. 5 is an illustration of signal waveforms representing operation of the circuits of FIG. 3.

FIG. 5 is an illustration of signal waveforms representing the change from the sampling phase to the active phase for the circuit of FIG. 3. Waveform 505 represents the change from the sampling phase to the active phase corresponding to activation of switch $S_X$ to connect the output of the last stage of the gain stage to the gate of the output transistor of the output stage. Waveform 510 represents the voltage $V_X$ at capacitor $C_{SHN}$, and waveform 515 represents the output voltage ($V_{OUT}$) at the source of the output transistor. Waveform 505 shows a charge sharing phase 520 immediately following the change from the sampling phase to the active phase.

As explained above, there will be a mismatch in voltage at the end of the sampling phase between $V_{OUT}$ and $V_X$. The voltage $V_{OUT}$ is determined according to $V_G = V_{OUT} + V_{GS}$. The voltage $V_X$ depends on the closed loop system in the sampling phase and the impedance of the last (Nth) stage of the gain stage during the sampling phase. The impedance of the output of the Nth stage during the sampling phase is not necessarily the same as during the active phase, causing $V_X$ and $V_G$ to have a mismatch. As shown in waveforms 510 and 515, $V_{OUT}$ and $V_X$ either drops or jumps according to the mismatch. The charge sharing phase is then followed by a recovery phase 525 during which the voltages settle. This glitch or noise at the output of the opamp is not desired. The noise can be reduced by increasing the capacitance of $C_{SHO}$, but this would involve a penalty in circuit size that may be undesirable. Another option is to greatly increase the drive current of the opamp to increase the bandwidth in order to quickly respond to ripple noise, but this increases the power consumption by the opamp circuit, which may also be undesirable.

Figure 6:
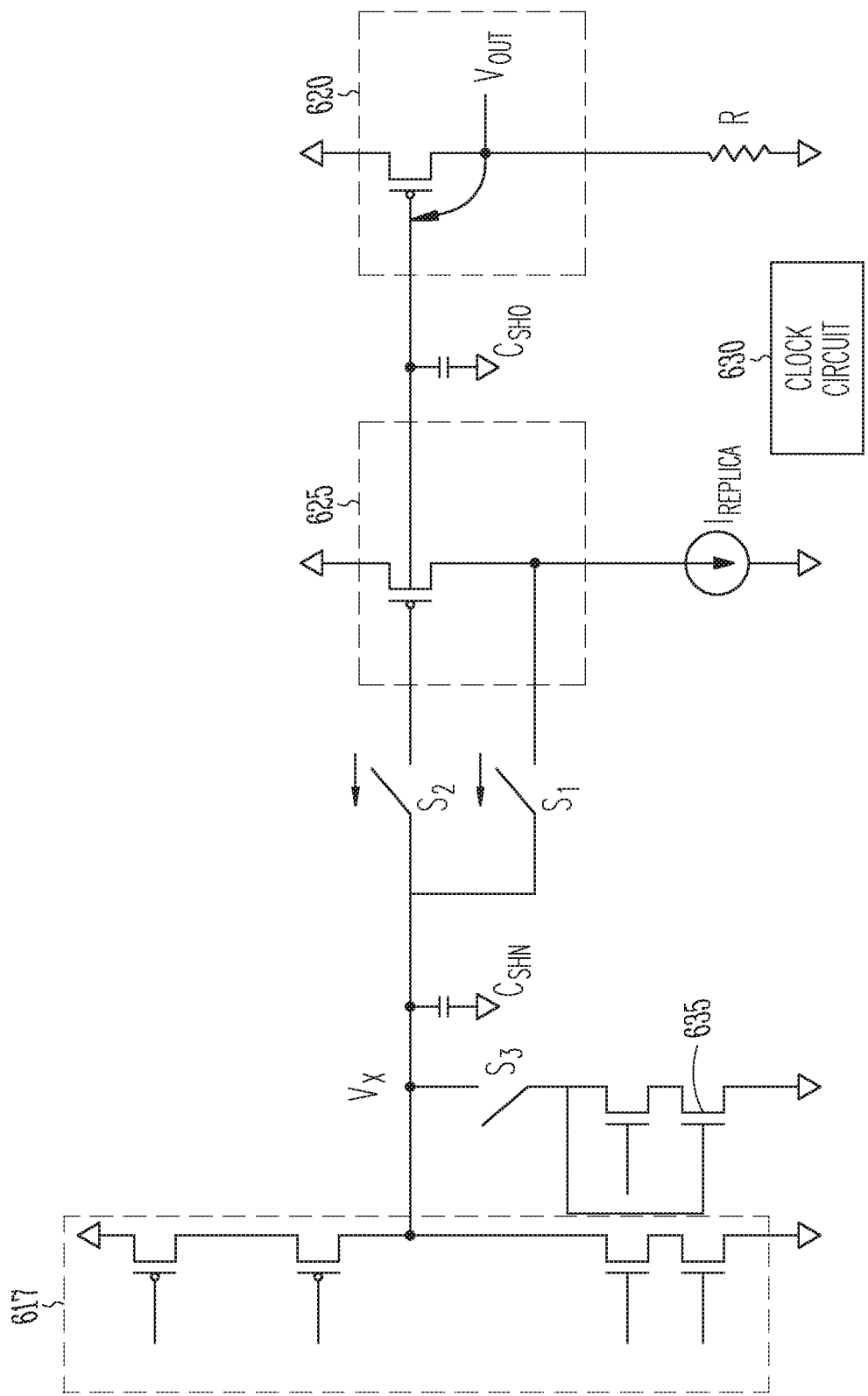
FIG. 6 is a circuit diagram of portions of an opamp circuit showing an approach for reducing offset in an opamp circuit.

FIG. 6 is a circuit diagram of portions of an opamp circuit showing another approach for reducing offset in the opamp of FIG. 2. The diagram shows the primary or operating output stage 620 of the opamp and a portion of the last (Nth) stage 617 of the gain stage of the opamp. The auto-zeroing circuit of the opamp includes a replica output stage 625. In the example of FIG. 6, the output stage is a source-follower output stage, and the replica output stage is a replica source-follower stage. Both stages include an NFET connected as a source-follower. Biasing current sink $I_{REPLICA}$ biases the NFET of the replica output stage.

Also shown in FIG. 6 is clock circuit 630. The clock circuit 630 generates one or more clock signals to operate the opamp circuit and the auto-zeroing circuit in multiple phases that include a sampling phase, an active phase, and an intermediate phase. The auto-zeroing circuit also includes switches $S_Y$ and $S_Z$ as shown in FIG. 3. In the embodiment of FIG. 6, switch $S_X$ in FIG. 3 is replaced by switches designated as S1, S2, and S3.

Figure 4B:
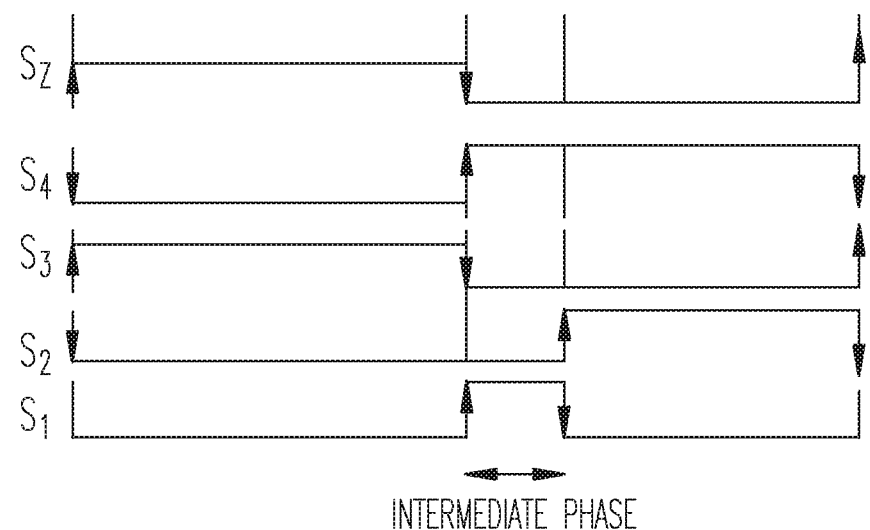

FIG. 4B is an illustration of clock signal waveforms used to operate switches $S_Y$, $S_Z$, S1, S2, and S3 in a sampling phase, an intermediate phase, and an active phase. In the sampling phase, switch $S_Y$ is open and switch $S_Z$ is closed. The primary output stage 620 and the replica output stage 625 are disconnected from the gain stage by a clock signal opening (deactivating) switches S1 and S2. An offset voltage is obtained on sample-and-hold capacitor $C_{SHN}$ while sample-and-hold capacitor $C_{SHO}$ maintains the gate voltage $V_G$ at the gate terminal of the output transistor.

A clock signal from the clock circuit 630 closes (activates) switch S3 during the sampling phase. The auto-zeroing circuit includes an impedance modifier circuit 635 that is connected to the output of the last stage of the gain stage by switch S3. The impedance modifier circuit 635 modifies the output impedance of the last stage to make it easier to sample all the offset voltages up to the last stage onto sample-and-hold capacitor $C_{SHN}$. In the embodiment of FIG. 6, the impedance modifier circuit 635 includes a diode connected transistor, and the impedance at the last stage is 1/gm of the diode connected transistor.

In the intermediate phase, only the replica output stage is first reconnected to the gain stage prior to the active phase by the clock circuit 630 closing (activating) switch S1, which is coupled to the source of the output transistor of the replica stage. When the replica output stage is reconnected, charge sharing occurs between the circuit node labeled $V_X$ and the replica output stage transistor. The primary output stage 520 is not impacted because switch S2 is still open and the gate of the transistor of the primary output stage is still held by capacitor $C_{SHO}$. This charge sharing prior to the active phase results in the DC bias of the gate terminal of the replica output stage being very close to the gate voltage dictated by the $V_{GS}$ and $V_{OUT}$ of the primary output stage. This reduces the noise or glitch at the output $V_{OUT}$. During the active phase following the intermediate phase, the clock circuit opens (deactivates) switch S1 to disconnect the source terminal of the transistor of the replica output stage, and closes (activates) switch S2 to reconnect the primary output stage and the gate terminal of the transistor of the replica output stage.

The sampling phase may be of the order of 50 nanoseconds (50 ns) to 200 ns. The duration of the sampling phase may depend on the open loop bandwidth of the opamp and its slew rate. Increasing the drive current (e.g., $I_{CC}$) to the opamp increases its bandwidth and slew rate and can reduce the time needed for the sampling phase. The active phase may be of the order of one microsecond (1 µs). The duration of the active phase can depend on leakage currents of the switches and the sampling capacitors. The leakage currents change the sampled offsets of the capacitors over time; which is corrected by the next sampling phase cycle. Increasing the capacitance of the sampling capacitors can increase the active time but will also increase the sampling time if the drive current is kept constant. The intermediate phase is of the order of 20 ns or less. Because the source follower stage has very low output impedance with low drive current, it can quickly provide the necessary charge to equalize the charge at circuit node $V_X$. The duration of the intermediate phase can increase with a larger $C_{SHN}$ capacitance or an S1 switch with higher impedance.

The replica output stage can be matched to the primary output stage by laying out the devices of the stages close to each other to minimize mismatch. The levels of the gate voltage of the primary output stage ($V_G$) and the output voltage of the replica stage can be made the same using one or both of the W/L ratio of the transistors and the $I_{DS}$ of the transistors by tuning $I_{REPLICA}$ of the replica output stage to the load current of the primary output stage. The residual difference between the $V_{GS}$ of the transistors will be the difference in Vth of the transistors, which will be small if the two devices are laid out close to each other on the integrated circuit.

It may be advantageous to have $V_{OUT}$ of the transistor of the replica output stage equivalent to the $V_G$ of the transistor of the primary output stage to minimize noise due to charge sharing when the primary output stage is reconnected during the active phase. The amount of difference between $V_X$ and $V_G$ during the sampling phase may depend on the circuit topology of the last stage of the gain stage. As shown in the equations above, the level of $V_{OUT}$ of the transistor of the replica output stage can be set by sizing the W/L ratio or the $I_{DS}$ of the transistor of the replica stage to have a $V_{GS}$ slightly higher than the $V_{GS}$ of the primary output stage.

Figure 7:
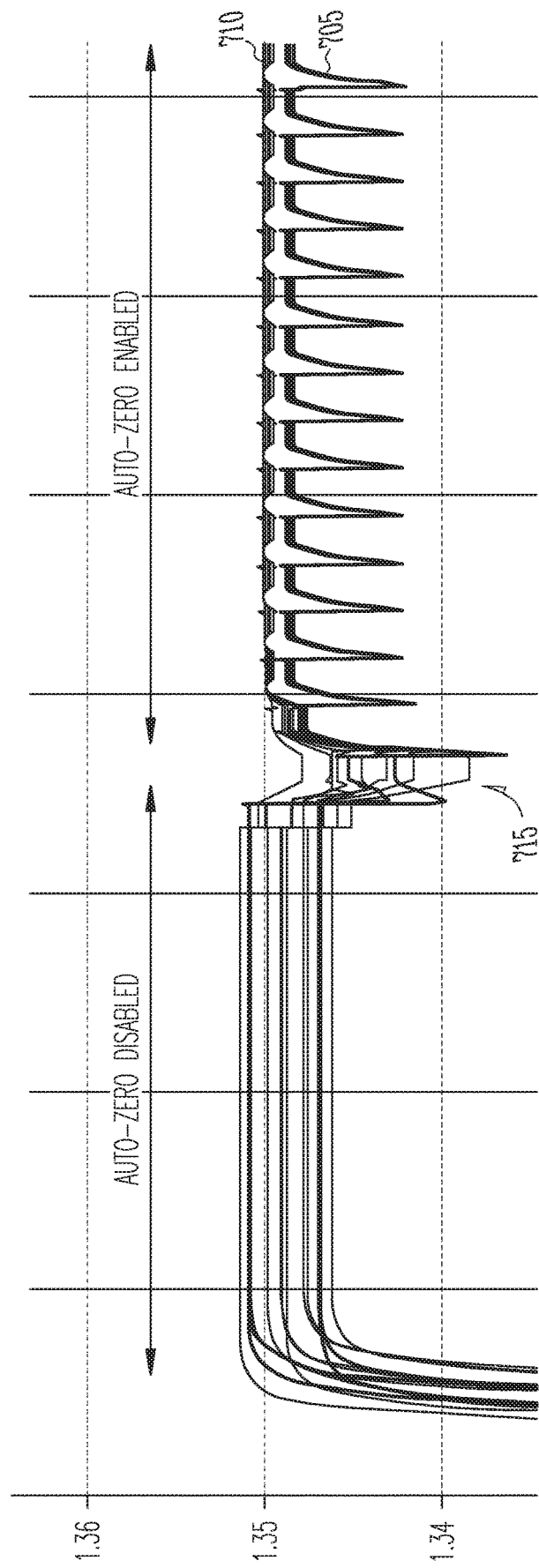
FIG. 7 is an illustration of the simulation of operation of the circuits of FIG. 3 and FIG. 6.

FIG. 7 is an illustration of Monte Carlo simulation of operation of the circuits of FIG. 3 and FIG. 6. Waveform 705 is $V_{OUT}$ for the circuit of FIG. 3 and waveform 710 is $V_{OUT}$ for the circuit of FIG. 6. Auto-zeroing in the circuits is enabled at 715. An offset in $V_{OUT}$ is evident prior to 715. After 715, the offset is reduced but ripple noise is evident in the $V_{OUT}$ waveforms. It can be seen that the output of the circuit of FIG. 3 is much noisier, and the circuit of FIG. 6 provides reduction in the ripple noise at the output. This can be important in higher precision analog circuit applications such as analog-to-digital converters (ADCs), digital-to-analog converters (DACs), temperature sensors, etc. The reduction in ripple noise is achieved without increasing the size of the sample-and-hold capacitors or increasing the drive current of the opamp to increase bandwidth. Additionally, no passive or active filters are employed thus resulting in further saving of one or both of area and current.

FIG. 8 is a flow diagram of a method of operating an opamp circuit. The opamp circuit includes a source-follower output stage and a replica of the source follower stage. The opamp circuit also includes an input stage and a gain stage. At 805, both the source-follower output stage and the replica source-follower stage are disconnected from the gain stage. At 810, the voltage of a first sample-and-hold circuit are applied to source-follower output stage to keep the output of the opamp stable. The offset voltages of the input stage and the gain stage are sampled onto a second sample-and-hold capacitor.

At 815, a source or drain terminal of an output transistor of the replica output stage is connected to the gain stage. The connection is maintained long enough for charge sharing between the second sample-and-hold capacitor and the output transistor to be completed and the voltages to settle. The source or drain of the output transistor of the replica output stage is then disconnected from the gain stage at 820. At 825, the gate of an output transistor of the source-follower output stage is reconnected and the offset voltage is applied to the gate of the output transistor.

Figure 9:
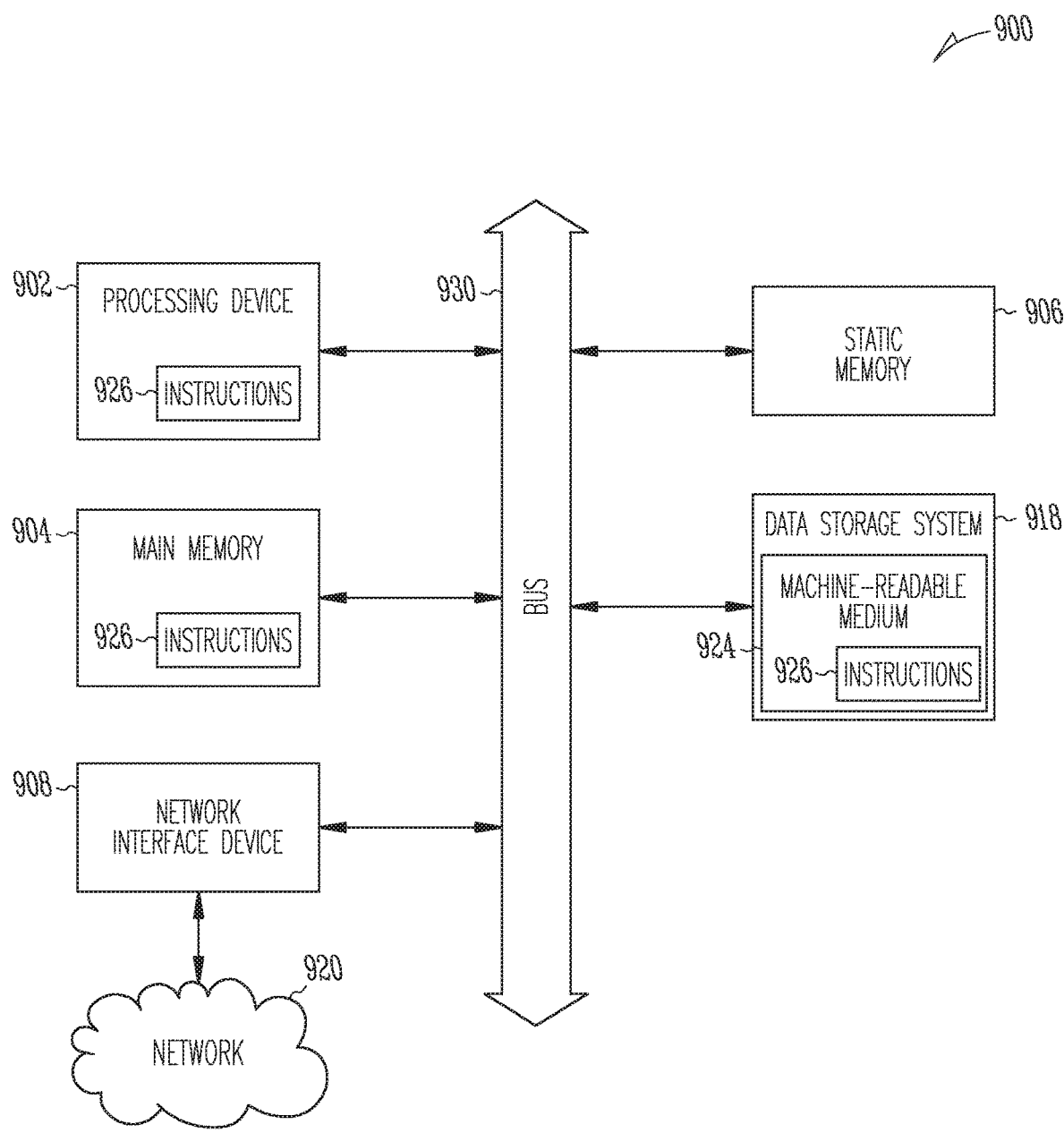
FIG. 9 illustrates a block diagram of an example machine according to some embodiments described herein.

FIG. 9 illustrates a block diagram of an example machine 900 upon which any one or more of the techniques (e.g., methodologies) discussed herein may perform. In alternative embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in peer-to-peer (P2P) (or other distributed) network environment. The machine 900 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 900 may include a processing device 902 (e.g., a hardware processor, a central processing unit (CPU), a graphics processing unit (GPU), a hardware processor core, or any combination thereof), a main memory 904 (e.g., read-only memory (ROM), flash memory, dynamic random-access memory (DRAM) such as synchronous DRAM (SDRAM) or Rambus DRAM (RDRAM), etc.), a static memory 906 (e.g., flash memory, static random-access memory (SRAM), etc.), and a data storage system 918, some or all of which may communicate with each other via an interlink (e.g., bus) 930.

The processing device 902 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 902 can also be one or more special-purpose processing devices such as an application specific integrated circuit (ASIC), a field programmable gate array (FPGA), a digital signal processor (DSP), network processor, or the like. The processing device 902 can be configured to execute instructions 926 for performing the operations and steps discussed herein. Amplifiers, Analog-Digital converters (ADC) and Digital-Analog converters (DAC) may be used by the device to communicate over bus 930 and/or execute internal operations. The computer system 900 can further include a network interface device 908 to communicate over a network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 or within the processing device 902 during execution thereof by the machine 900, the main memory 904 and the processing device 902 also constituting machine-readable storage media. Amplifiers, Analog-Digital converters (ADC) and Digital-Analog converters (DAC) may be used by the device to communicate over bus 930 and/or execute internal operations.

While the machine-readable storage medium 924 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EPROM)), NAND and NOR flash memory devices, phase change memory devices, 3DXP memory devices, spin-transfer torque memory devices (STTRAM) and other magnetic memories; magnetic disks, such as internal hard disks and removable disks; magneto-optical disks; and CD-ROM and DVD-ROM disks. Amplifiers, Analog-Digital converters (ADC) and Digital-Analog converters (DAC) may be used by the device to communicate over bus 930 and/or execute internal operations.

The machine 900 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 900 may include an output controller, such as a serial (e.g., universal serial bus (USB)), parallel, or other wired or wireless interface (e.g., infrared (IR), near field communication (NFC), etc.) to communicate or control one or more peripheral devices (e.g., a printer, card reader, etc.).

The instructions 926 (e.g., software, programs, an operating system (OS), etc.) or other data are stored on the data storage system 918 can be accessed by the main memory 904 for use by the processing device 902. The main memory 904 (e.g., DRAM) is typically fast, but volatile, and thus a different type of storage than the data storage system 918 (e.g., an SSD), which is suitable for long-term storage, including while in an "off" condition. The instructions 926 or data in use by a user or the machine 900 are typically loaded in the main memory 904 for use by the processing device 902. When the main memory 904 is full, virtual space from the data storage system 918 can be allocated to supplement the main memory 904; however, because the data storage system 918 is typically slower than the main memory 904, and write speeds are typically at least twice as slow as read speeds, use of virtual memory can greatly reduce user experience due to storage device latency (in contrast to the main memory 904, e.g., DRAM). Further, use of the data storage system 918 for virtual memory can greatly reduce the usable lifespan of the data storage system 918.

In contrast to virtual memory, virtual memory compression (e.g., the Linux™ kernel feature "ZRAM") uses part of the memory as compressed block storage to avoid paging to the data storage system 918. Paging takes place in the compressed block until it is necessary to write such data to the data storage system 918. Virtual memory compression increases the usable size of the main memory 904, while reducing wear on the data storage system 918.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host (e.g., a host device), and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host using a low-voltage differential signaling (LVDS) serial interface with dedicated read/write paths, further advancing greater read/write speeds.

The instructions 924 may further be transmitted or received over a network 920 using a transmission medium via the network interface device 908 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 908 may include one or more physical jacks (e.g., Ethernet, coaxial, or phone jacks) or one or more antennas to connect to the network 920. Amplifiers, Analog-Digital converters (ADC) and Digital-Analog converters (DAC) may be used by the device to communicate over bus 930 and/or execute internal operations. In an example, the network interface device 908 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 900, and includes digital or analog communications signals or other intangible medium to facilitate communication of such software.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic circuit comprising:
    an input stage;
    a gain stage operatively coupled to the input stage;
    a primary output stage operatively coupled to the gain stage wherein the primary output stage is a source-follower output stage;
    a replica output stage operatively coupled to the gain stage in parallel to the primary output stage, wherein the replica output stage is a replica source-follower stage; and
    a clock circuit configured to operate the electronic circuit in multiple phases including:
        a sampling phase to disconnect the primary output stage and the replica output stage from the gain stage to obtain an offset voltage;
        an active phase to reconnect the primary output stage to apply the offset voltage to reduce an offset at the primary output stage; and
        an intermediate phase to first reconnect the replica output stage to the gain stage prior to the active phase.

2. The electronic circuit of claim 1, including:
    a first switch circuit coupled to an output of the gain stage and a source or drain of an output transistor of the replica source-follower stage;
    a second switch circuit coupled to the output of the gain stage, a gate of the output transistor of the replica source-follower stage and a gate of an output transistor of the source follower output stage; and
    wherein the clock circuit is configured to produce a clock signal that deactivates the first switch circuit and the second switch circuit during the sample phase, activates the first switch and deactivates the second switch circuit during the intermediate phase, and deactivates the first switch circuit and activates the second switch circuit during the active phase.

3. The electronic circuit of claim 2, including:
    an impedance modifier circuit element;
    a third switch circuit connected between the impedance modifier circuit element and an output of the gain stage; and
    wherein the clock signal activates the third switch circuit during the sampling phase and deactivates the third switch circuit during the intermediate phase and active phase.

4. The electronic circuit of claim 3, wherein the impedance modifier circuit element includes a diode connected transistor.

5. The electronic circuit of claim 3, including:
    a first input transistor and a second input transistor included in the input stage and coupled as a differential transistor pair, wherein the gate of the first transistor is an input circuit node;
    a fourth switch circuit coupled between the gates of the first and second input transistors;
    a feedback circuit coupled to the source-follower output stage;
    a feedback circuit path including a fifth switch circuit connected between the feedback circuit and a gate of the second transistor of the differential input stage; and
    wherein the clock signal activates the fourth switch circuit and deactivates the fifth switch circuit during the sampling phase, and deactivates the fourth switch circuit and activates the fifth switch circuit during the intermediate phase and active phase.

6. The electronic circuit of claim 1, including:
    a first sample-and-hold capacitor connected to a gate of an output transistor of the source-follower output stage; and
    a second sample-and-hold capacitor connected to an output of the gain stage.

7. The electronic circuit of claim 6, including:
    a first input transistor and a second input transistor included in the input stage and coupled as a differential transistor pair, wherein the gate of the first transistor is an input circuit node;
    wherein the gain stage comprises multiple intermediate gain stages between an input of the gain stage and the output of the gain stage; and
    wherein offset voltages of the differential transistor pair and the multiple intermediate gain stages are sampled onto the second sample-and-hold capacitor during the sampling phase.

8. The electronic circuit of claim 1, wherein the source-follower output stage and the replica source-follower stage each include an output transistor, and a gate-to-source voltage ($V_{GS}$) of the output transistor of the replica source-follower stage is greater than the gate-to-source voltage of the output transistor of the source-follower output stage.

9. A method of operating an operational amplifier (opamp) circuit, the method comprising:
    disconnecting a source-follower output stage of the opamp circuit and a replica source-follower stage of the opamp circuit from a gain stage of the opamp circuit;
    applying voltage of a first sample-and-hold capacitor to the source-follower output stage, and sampling an offset voltage of the gain stage and an input stage of the opamp circuit onto a second sample-and-hold capacitor;
    connecting a source or drain of an output transistor of the replica output stage to the gain stage;
    disconnecting the source or drain of the output transistor of the replica output stage from the gain stage; and
    reconnecting a gate of an output transistor of the source-follower output stage and applying the offset voltage to the gate of the output transistor of the source-follower output stage.

10. The method of claim 9, including reconnecting a gate of an output transistor of the replica source-follower stage when reconnecting the gate of the output transistor of the source-follower output stage.

11. The method of claim 9, including:
    disconnecting a feedback circuit path of the opamp circuit when disconnecting the source-follower output stage and replica source-follower output stage; and
    reconnecting the feedback circuit path when reconnecting the gate of the output transistor of the source-follower output stage.

12. The method of claim 9, including:
connecting gates of transistors of an input differential transistor pair of the opamp circuit together when disconnecting the source-follower output stage and the replica source-follower stage from the gain stage; and
disconnecting the gates of the transistors of the input differential transistor pair when reconnecting the gate of the output transistor of the replica output stage and the gate of an output transistor of the source-follower output stage.

13. The method of claim 12, wherein sampling the offset voltage includes sampling offset voltages of the input stage and multiple intermediate gain stages of the gain stage onto the second sample-and-hold capacitor.

14. An electronic system comprising
an operational amplifier (opamp) circuit including:
an input stage;
a gain stage; and
a source-follower output stage; and
an auto-zeroing circuit including;
a replica source-follower stage operatively coupled to the gain stage in parallel the source follower output stage; and
a clock circuit configured to operate the auto-zeroing circuit in multiple phases including:
a sampling phase to disconnect the source-follower output stage and the replica source-follower stage from the gain stage to obtain an offset voltage;
an active phase to reconnect the source-follower output stage to apply the offset voltage to reduce an offset at, the source-follower output stage; and
an intermediate phase to first reconnect the replica source-follower stage to the gain stage prior to the active phase.

15. The electronic system of claim 14, wherein the auto-zeroing circuit includes:
a first switch circuit coupled to an output of the gain stage and a source or drain of an output transistor of the replica source-follower stage;
a second switch circuit coupled to the output of the gain stage, a gate of the output transistor of the replica source-follower stage, and a gate of an output transistor of the source follower output stage; and
wherein the clock circuit is configured to produce a clock signal that deactivates the first switch circuit and the second switch circuit during the sample phase, activates the first switch and deactivates the second switch circuit during the intermediate phase, and deactivates the first switch circuit and activates the second switch circuit during the active phase.

16. The electronic system of claim 15, wherein the auto-zeroing circuit includes:
an impedance modifier circuit element;
a third switch circuit connected between the impedance modifier circuit element and an output of the gain stage; and
wherein the clock signal activates the third switch circuit during the sampling phase and deactivates the third switch circuit during the intermediate phase and active phase.

17. The electronic system of claim 16,
wherein the opamp circuit includes:
a first input transistor and a second input transistor included in the input stage and coupled as a differential transistor pair, wherein the gate of the first transistor is an input circuit node; and
a feedback circuit coupled to the source-follower output stage;
a feedback circuit path from the feedback circuit to a gate of the second transistor of the differential input stage;
wherein the auto-zeroing circuit includes:
a fourth switch circuit coupled between the gates of the first and second input transistors;
a fifth switch circuit between the feedback circuit and the gate of the second transistor of the differential input stage; and
wherein the clock signal activates the fourth switch circuit and deactivates the fifth switch circuit during the sampling phase, and deactivates the fourth switch circuit and activates the fifth switch circuit during the intermediate phase and active phase.

18. The electronic system of claim 14, wherein the auto-zeroing circuit includes:
a first sample-and-hold capacitor connected to a gate of an output transistor of the source-follower output stage; and
a second sample-and-hold capacitor connected to an output of the gain stage.

19. The electronic system of claim 18, wherein the gain stage of the opamp circuit comprises multiple intermediate gain stages between an input of the gain stage and the output of the gain stage; and wherein the auto-zeroing circuit is configured to sample offset voltages of the input stage and the multiple intermediate gain stages onto the second sample-and-hold capacitor during the sampling phase.

* * * * *